United States Patent
Grosse et al.

(10) Patent No.: US 10,939,596 B1
(45) Date of Patent: Mar. 2, 2021

(54) OPTICAL WINDOW WITH INTEGRATED TEMPERATURE SENSING

(71) Applicant: RAYTHEON COMPANY, Waltham, MA (US)

(72) Inventors: Kyle L. Grosse, Elk Grove Village, IL (US); Gary A. Frazier, Garland, TX (US); Catherine Trent, Allen, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/537,214

(22) Filed: Aug. 9, 2019

(51) Int. Cl.
   *H05K 9/00* (2006.01)

(52) U.S. Cl.
   CPC ......... *H05K 9/0094* (2013.01); *H05K 9/0005* (2013.01); *H05K 9/0086* (2013.01)

(58) Field of Classification Search
   CPC .... H05K 9/0005; B64C 1/1484; B64C 1/1492
   See application file for complete search history.

(56) References Cited

U.S. PATENT DOCUMENTS

| | | | |
|---|---|---|---|
| 2,644,065 A * | 6/1953 | Peterson | B64C 1/1484 338/25 |
| 5,139,850 A * | 8/1992 | Clarke | C03C 17/36 174/389 |
| 5,208,603 A | 5/1993 | Yee | |
| 5,619,365 A | 4/1997 | Rhoads et al. | |
| 6,545,500 B1 | 4/2003 | Field | |
| 6,646,605 B2 | 11/2003 | McKinzie, III et al. | |
| 7,592,957 B2 | 9/2009 | Achour et al. | |
| 7,611,746 B2 * | 11/2009 | Funaki | C03C 17/34 427/487 |
| 8,889,218 B2 * | 11/2014 | Eberle | H05K 9/0005 427/123 |
| 9,146,437 B2 | 9/2015 | Driscoll et al. | |

(Continued)

FOREIGN PATENT DOCUMENTS

| | | |
|---|---|---|
| CN | 107402383 A | 11/2017 |
| CN | 108390134 A | 8/2018 |

(Continued)

OTHER PUBLICATIONS

Hearn, David R. "Vacuum window optical power induced by temperature gradients", Earth Observing Systems IV (1999), pp. 1-12.

(Continued)

*Primary Examiner* — Hung V Ngo
(74) *Attorney, Agent, or Firm* — Lando & Anastasi, LLP

(57) ABSTRACT

Methods and apparatus for measuring and optionally adjusting the temperature profile of an optical window. In one example, an optical window with integrated temperature sensing functionality includes a first window layer of an optically transparent material, a second window layer of the optically transparent material, an electromagnetic interference shielding grid disposed between the first and second window layers and including a first electrically conductive structure and a second electrically conductive structure, and a thermally sensitive material disposed between the first and second electrically conductive structures, the thermally sensitive material having an electrical property that varies as a function of temperature.

17 Claims, 3 Drawing Sheets

(56) References Cited

U.S. PATENT DOCUMENTS

| | | |
|---|---|---|
| 2005/0012677 A1 | 1/2005 | Brown et al. |
| 2005/0179614 A1 | 8/2005 | Nagy |
| 2009/0096545 A1 | 4/2009 | O'Hara et al. |
| 2010/0168935 A1* | 7/2010 | Rashid .................. B64C 1/1484 701/3 |
| 2014/0266517 A1 | 9/2014 | Werner et al. |
| 2017/0082572 A1* | 3/2017 | Jiao .................... G01R 27/2635 |
| 2017/0102601 A1* | 4/2017 | Luten ..................... G02B 5/282 |
| 2017/0273142 A1* | 9/2017 | Denis .................. H05B 1/0236 |
| 2019/0265570 A1* | 8/2019 | Whittingham ........ G02F 1/1533 |

FOREIGN PATENT DOCUMENTS

| | | |
|---|---|---|
| DE | 2551366 A1 | 5/1977 |
| EP | 2916387 A1 | 9/2015 |
| JP | S6242209 A | 2/1987 |

OTHER PUBLICATIONS

Pilette et al. "Thermal Stresses in Double-Glazed Windows", Canadian Journal of Civil Engineering (1988) vol. 15, No. 5, pp. 807-814.

Shuai Zhao et al: "Electrically triggered dual-band tunable terahertz metamaterial band-pass filter based on Si3N4-VO2-Si3N4 sandwich," Chinese Physics B, (2019) vol. 28, No. 5.

Jun-Hwan Shin et al: "Electrically controllable terahertz square-loop metamaterial based on VO2 thin film," Nanotechnology, Institute of Physics Publishing, (2016) vol. 27, No. 19.

D. J. Park et al: "Electrically controllable THz asymmetric split-loop resonator with an outer square loop based on VO2," Optics Express, (2018) vol. 26, No. 13.

* cited by examiner

OPTICAL WINDOW WITH INTEGRATED TEMPERATURE SENSING

BACKGROUND

Optical domes and windows are used in a variety of systems and applications where an optically transparent window is needed, for example, in airborne imaging systems to protect underlying imaging optics from the environment. These domes or windows can be subjected to significant aerodynamic heating effects that introduce detrimental wavefront errors that impair performance. There are currently no direct method to measure and correct the temperature distribution across the aperture. Some conventional approaches to handling thermal effects have included using two pane window designs, and attempting to correct for thermal gradients across an aperture by uniformly heating the entire aperture, which leads to increased emissions and noise. Some approaches have involved attempting to measure thermal gradients across the aperture by placing a thermal (i.e., infrared) camera behind the aperture to record the spatial temperature distribution in the aperture, and then heating the aperture by resistively heating embedded wires to above the aero-heating temperature.

SUMMARY OF INVENTION

Aspects and embodiments are directed to methods and apparatus for providing active spatial control of the electro-optic/thermal (EO/IR) or RF properties of an aperture. In particular, various aspects enable correction of thermally-driven aberrations in an optical aperture, as well as real-time, high-spatial resolution temperature measurements across an aperture.

According to one embodiment, an optical window comprises a first window layer of an optically transparent material, a second window layer of the optically transparent material, an electromagnetic interference shielding grid disposed between the first and second window layers and including a first electrically conductive structure and a second electrically conductive structure, and a thermally sensitive material disposed between the first and second electrically conductive structures, the thermally sensitive material having an electrical property that varies as a function of temperature.

In one example, the first electrically conductive structure includes a first plurality of electrically conductive wires and the second electrically conductive structure includes a second plurality of electrically conductive wires. In another example, the first and second pluralities of electrically conducive wires are arranged in a rectilinear grid with the first plurality of electrically conductive wires oriented in a first direction and the second plurality of electrically conductive wires oriented in a second direction perpendicular to the first direction.

In another example, the thermally sensitive material forms a Schottky contact with at least some of the first plurality of electrically conductive wires or at least some of the second plurality of electrically conductive wires.

In one example, the thermally sensitive material is a chalcogenide.

In another example, the thermally sensitive material having minimal impact on installed sensor performance is one of germanium, zinc oxide (ZnO), vanadium oxide (VOx), and nickel chromium (NiCr).

In another example, the thermally sensitive material is a semiconductor.

In one example, the electrical property of the thermally sensitive material is electrical resistance.

According to another embodiment, an optical system comprises an optical window including an embedded electromagnetic interference shield and a thermally sensitive material disposed around the embedded electromagnetic interference shield, the electromagnetic interference shield including a first electrically conductive structure and a second electrically conductive structure, and the thermally sensitive material having an electrical property that varies as a function of temperature, and a controller coupled to the embedded electromagnetic interference shield and configured to measure the electrical property of the thermally sensitive material to determine a temperature profile of the optical window.

In one example, the first electrically conductive structure includes a first plurality of electrically conductive wires and the second electrically conductive structure includes a second plurality of electrically conductive wires. In one example, the thermally sensitive material forms a Schottky contact with at least some of the first plurality of electrically conductive wires or at least some of the second plurality of electrically conductive wires. In another example, the first and second pluralities of electrically conducive wires are arranged in a rectilinear grid with the first plurality of electrically conductive wires oriented in a first direction and the second plurality of electrically conductive wires oriented in a second direction perpendicular to the first direction. In one example, the controller is configured to selectively bias one or more wires of the first plurality of electrically conductive wires and one or more wires of the second plurality of electrically conductive wires to resistively heat the selected wires of the first plurality of electrically conductive wires and of the second plurality of electrically conductive wires to locally alter the electrical property of the thermally sensitive material in a region proximate the selected wires of the first plurality of electrically conductive wires and of the second plurality of electrically conductive wires. In one example, the electrical property of the thermally sensitive material is electrical resistance. In another example, the controller is configured to selectively bias the selected wires of the first plurality of electrically conductive wires and of the second plurality of electrically conductive wires based on the temperature profile of the optical window. In one example, the thermally sensitive material is one of a chalcogenide, germanium, zinc oxide (ZnO), vanadium oxide (VOx), and nickel chromium (NiCr). In another example, the thermally sensitive material is a semiconductor.

According to another embodiment, a method of controlling a temperature profile of an optical window comprises measuring a temperature-dependent electrical property of a thermally sensitive material included in the optical window using an embedded electromagnetic interference shield in the optical window to determine the temperature profile of the optical window, the embedded electromagnetic interference shield including a two-dimensional array of electrically conductive wires, and based on the measurements, selectively biasing individual wires of the two-dimensional array of electrically conductive wires to adjust the temperature-dependent electrical property of the thermally sensitive material in at least one selected spatial region of the optical window to control the temperature profile of the optical window.

In one example, selectively biasing the individual wires includes applying a voltage bias to resistively heat the individual wires and the thermally sensitive material in the at least one selected spatial region.

In another example, measuring the temperature-dependent electrical property of the thermally sensitive material includes measuring electrical resistance of the thermally sensitive material.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1B:
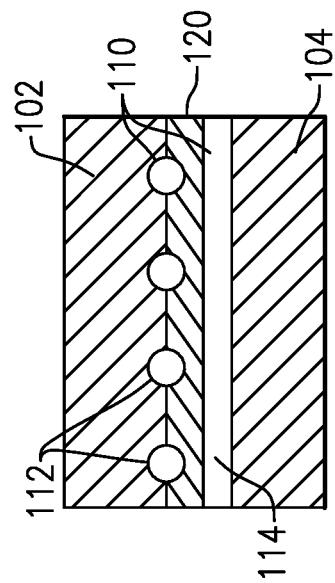
FIG. 1B is a schematic diagram showing a cross-sectional view of a portion of the optical window of FIG. 1A.

Integration of electro-optic or infrared imaging systems onto high supersonic and hypersonic vehicles is limited by the performance of optical windows, which are subjected to aerodynamic heating, also referred to as thermal bruising. Aspects and embodiments provide an optical window with integrated temperature sensors to create a thermally "smart" window that senses temperature and enables dynamic optical correction of the distortions caused by aerodynamic or other heating effects. As discussed further below, according to certain embodiments, a thermally sensitive material is integrated into an existing optical window structure, for example, between electromagnetic interference shielding layers, to produce a structure that allows for direct and local measurements of window temperature. This thermally sensitive material does not significantly impair sensor performance. According to certain aspects, coupling these thermal measurements with dynamic temperature control allows for correction of thermally induced optical distortions. As discussed above, conventional solutions to the problem of aerodynamic heating involves integrating an additional infrared camera into the system for measuring window temperature, which negatively impacts the system size, weight, power, and cost (SWaP-C). In contrast, aspects and embodiments leverage existing window structure and electronics to provide dynamic thermal correction with minimal impact to the system SWaP-C.

Optical windows used in many systems and applications include an integrated electromagnetic interference (EMI) shield that typically includes a grid of conductive wires. According to certain embodiments, a thermally sensitive material is inserted between the conductive wires making up the EMI grid. The thermally sensitive material is a material that exhibits temperature-dependent changes in one or more electrical properties. The EMI wires are used as electrodes for measuring the changing electrical properties of the thermally sensitive material with temperature. In addition, according to certain embodiments, the EMI wires can be biased as resistive heaters to selectively heat specific areas of the window. Thus, aspects and embodiments provide methods and apparatus to directly sense the temperature field across an aperture and selectively spatially heat the aperture to counter negative effects, such as optical distortion, caused by non-uniform heating across the aperture. Embodiments of the optical window with integrated temperature sensing and control may be useful in a wide variety of systems and applications. For example, an optical imaging system incorporating an embodiment of the window may be able to correct for the thermally-induced optical distortions that occur during hypersonic flight.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1A:
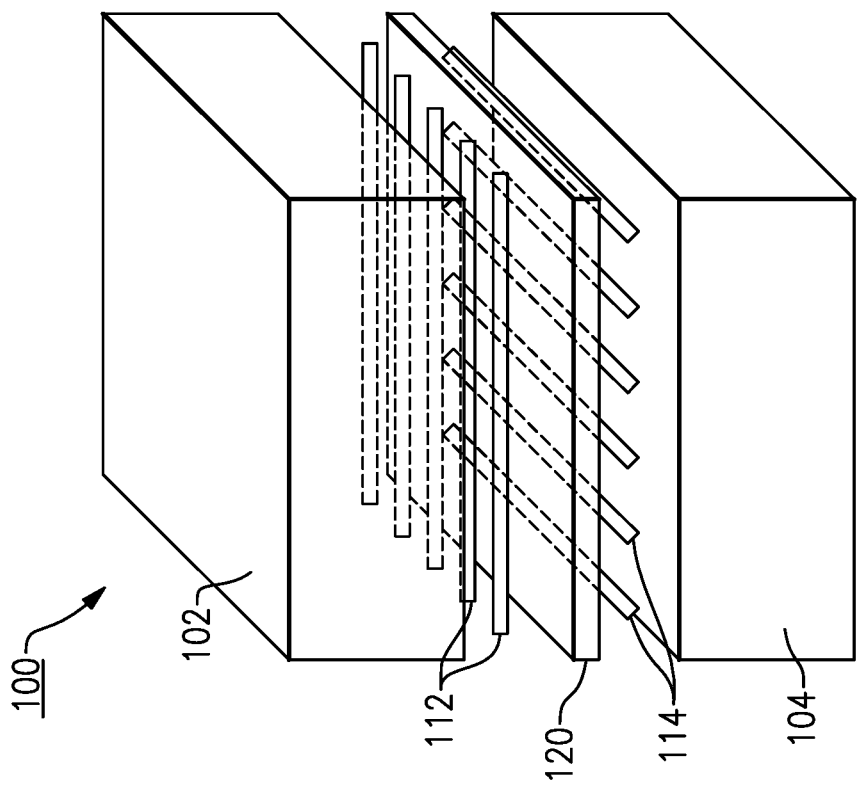
FIG. 1A is schematic diagram showing an exploded view of one example of an optical window with integrated temperature sensing according to aspects of the present invention.

Referring to FIG. 1A, there is illustrated, in exploded view, a schematic diagram of one example of an optical window according to certain embodiments. FIG. 1B shows a corresponding cross-sectional view of a portion of the optical window of FIG. 1A. The optical window 100 includes a first layer 102 of an optically transparent window material and a second layer 104 of the optically transparent window material. As used herein the term "optically transparent" is intended to refer to a material that is substantially transmissive to optical radiation within one or more spectral bands of interest (e.g., visible light or one or more regions of the infrared spectrum). The window material may be any suitable optically transparent material, including, for example, glass, sapphire, or optical ceramic materials. The optical window 100 includes an embedded electromagnetic interference (EMI) shield 110 that, in the illustrated example, includes a first plurality of electrically conductive wires 112 and a second plurality of electrically conductive wires 114 arranged in a two-dimensional rectilinear grid. A thermally sensitive material 120 is disposed between the two sets of electrically conductive wires 112, 114.

The presence of the thermally sensitive material 120 creates a gap between the first and second pluralities of electrically conductive wires 112, 114; however, the thermally sensitive material 120 may be in the form of a thin layer or film that does not adversely affect performance of the EMI shield 110. For example, simulations have demonstrated that separating the first and second pluralities of electrically conductive wires 112, 114 by about several micrometers (μm) does not impact the performance of the EMI shield 110. The thermally sensitive material 120 may be selected both for its temperature-dependent properties and for compatibility with the fabrication processes for the optical window 100. Examples of thermally sensitive materials 120 that can be used include zinc oxide (ZnO), germanium, chalcogenides, nickel chromium (NiCr), and vanadium oxide (VOx).

In the example shown in FIG. 1A, and in various examples discussed below, the EMI shield 110 includes two sets of electrically conductive wires 112, 114 arranged in a rectilinear pattern; however, embodiments of the optical window 100 are not limited to this arrangement for the EMI shield 110. As will be appreciated by those skilled in the art, the EMI shield 110 may have various structures and may be constructed in various ways. For example, the sets of wires 112, 114 may be implemented as printed conductive traces or other conductive structures rather than "wires" per se. Accordingly, although for simplicity, examples of the EMI shield 110 may be discussed herein as including a grid of two sets (or pluralities) or electrically conductive wires 112, 114, this is not intended to be limiting and the EMI shield 110 may be implemented using two layers of conductive material formed by any suitable technology/structure. The first and second pluralities of wires 112, 114 may be made of any electrically conductive structures, including, but not limited to, copper wires/traces, gold wires/traces, or carbon nanotubes, for example. Further, the two sets of wires 112, 114 need not be arranged in a rectilinear pattern as shown, but may instead be arranged differently, for example, in a "diamond" shaped, rather than square shaped, grid (e.g., crossing at an angle other than 90 degrees), in a circular or elliptical pattern, using curved rather than straight wires, or any of a wide variety of other regular or irregular patterns.

Figure 2B:
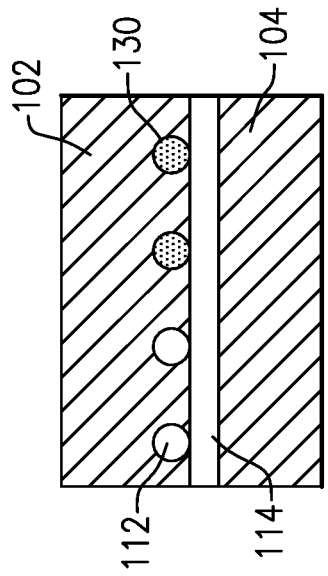
FIG. 2B is a schematic diagram showing a cross-sectional view of the portion of the optical window of FIG. 2A.
Figure 2C:
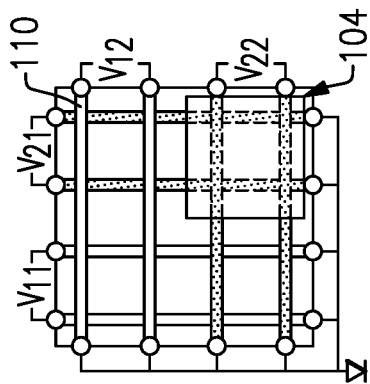
FIG. 2C is a schematic diagram of a portion of an example of an embedded temperature sensing and control array for embodiments of the optical window, according to aspects of the present invention.
Figure 2A:
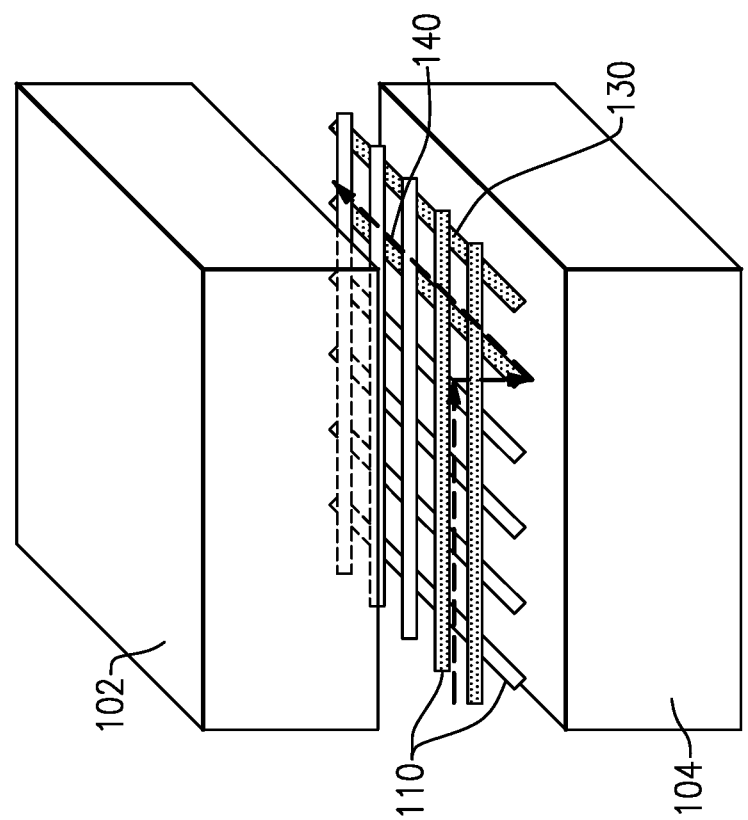
FIG. 2A is a schematic diagram showing a partial exploded view of an example of the optical window with integrated temperature sensing according to aspects of the present invention.

As discussed above, the thermally sensitive material 120 has at least one electrical property or characteristic, such as electrical resistance or conductivity, for example, that varies as a function of temperature. Accordingly, aspects and embodiments leverage the array of wires 112, 114 of the EMI shield 110 to sense the temperature across the aperture by measuring the temperature-dependent property of the thermally sensitive material 120. The wires of an EMI shield used in an optical window are generally terminated to a common ground around the aperture. In contrast, according to certain embodiments, the first and second pluralities of wires 112, 114 are terminated to electrical contacts (e.g., electrodes, contact pads, etc.) that can be biased relative to a shared ground, allowing for electrical interrogation and control of different rows and columns of wires in the grid. This concept is illustrated in FIGS. 2A, 2B, and 2C. For simplicity, the thermally sensitive material 120 is not shown in FIGS. 2A-C.

According to certain embodiments, the resistance of the wires 112, 114 can be measured across the grid to map resistance changes due to temperature. The thermally sensitive material 120 is disposed in the grid between the electrically conductive wires 112, 114, and thus by selectively biasing certain groups or subsets 130 of one or more of the wires, the section of the thermally sensitive material 120 between those wires may be interrogated. If the thermally sensitive material 120 changes in temperature in a certain area, it exhibits a local change in one or more electrical properties in that area, which can be measured. Referring to FIG. 2A, in certain examples, the thermally sensitive material 120 may be more resistive than the electrically conductive wires 112, 114, and therefore the current applied to the biased wires 130 travels from one wire to another, as indicated by arrow 140. In certain examples, a relatively low current can be applied to the biased wires 130 and the changing resistance can be measured. Based on a known relationship between the resistance and temperature of the thermally sensitive material 120, and by selectively biasing different groups or subsets of the wires in the EMI shield 110, a temperature profile of the optical window 100 can be created. The measurements can be repeated continuously or periodically to dynamically update the temperature profile over time.

In certain embodiments, the thermally sensitive material 120 is composed at least in part of a semiconducting layer such that contacts between the electrically conductive wires 112 form Schottky contact with at least one set of the wires 112. It is well known that the current versus voltage response of Schottky diodes is a strong function of temperature. Applying an electrical bias between the wires 112 produces a measurable current through the diode(s) thus formed that is strong function of temperature. Therefore, the bulk of spacer 120 may be composed of slightly electrically conductive material with relatively small temperature dependence and the Schottky contact to material 120 may be used to provide the primary indication of temperature or temperature change.

Thus, according to certain embodiments, a method of measuring the temperature profile of a surface, such as the optical window 100, includes integrating the thermally sensitive material 120 into regions or gaps between an electrically conductive material, such as the wires of the EMI shield 110, using voltage biases to pass electrical current though the integrated thermally sensitive material 120, and measuring the current flow through the integrated thermally sensitive material 120 or the biased wires 130 of the EMI shield 110 to determine the local temperature across the aperture.

In addition, according to certain embodiments, the EMI shield can also be biased as resistive heaters and used to selectively heat specific regions of the optical window 100. For example, referring to FIG. 2C, selected portions of the first and second pluralities of wires 112, 114 of the EMI shield 110 can have individual bias voltages (e.g., $V_{11}$, $V_{21}$, etc.) applied that can be controlled to drive electrical current to specific areas of the aperture. The voltage biases can be used to resistively heat the selected wires of the EMI shield 110 along with the surrounding area of the thermally sensitive material 120. Controlled heating of the thermally sensitive material 120 changes the temperature-dependent property or properties of the thermally sensitive material 120 in a known and controlled manner, such that the property or properties of the thermally sensitive material 120 can be spatially adjusted as desired. For example, based on the measured temperature profile of the aperture obtained as discussed above, the thermally sensitive material 120 can be selectively heated and adjusted to compensate for thermal gradients across the optical window 100 and thereby reduce associated optical distortion. Thus, according to certain embodiments, a method of spatially measuring and controlling properties across an aperture includes connecting edges (or other points) of an electrically conductive material, such as the wires of the embedded EMI shield 110, to individual biases, controlling the biases to drive electrical current to specific areas of the aperture, and using the voltage biases to resistively heat the electrically conductive material and the surrounding area of the aperture to locally alter the physical properties of the aperture. The integration of the thermally sensitive material 120 around and between the conductive material of the EMI shield enables a higher fidelity of spatially adjusting aperture properties, which may significantly improve the performance of the optical window, particularly in applications where aerodynamic or other spatially variable heating occurs.

Simulations and modeling have demonstrated that a "lossy" conductor such as undoped carbon nanotubes used for the first and second pluralities of wires 112, 114 can deliver a heat pulse of 600-900° C. in 50 µs, which can change the electrical properties of thermally sensitive materials and the aperture. For examples, calculations indicate that chalcogenides and germanium may exhibit a 25% change in resistance for the temperature ranges of interest. The peak carbon nanotube current density is ~106 A/cm$^2$ which is below the maximum current density of ~4*109 A/cm$^2$. Also, the maximum temperature of the carbon nanotubes is 900° C. which is also well below the "melt" temperature of ~2200° C. for carbon nanotubes. The simulations further show that, for this example, the temperature of the surrounding material is ~200-300° C.

Figure 3:
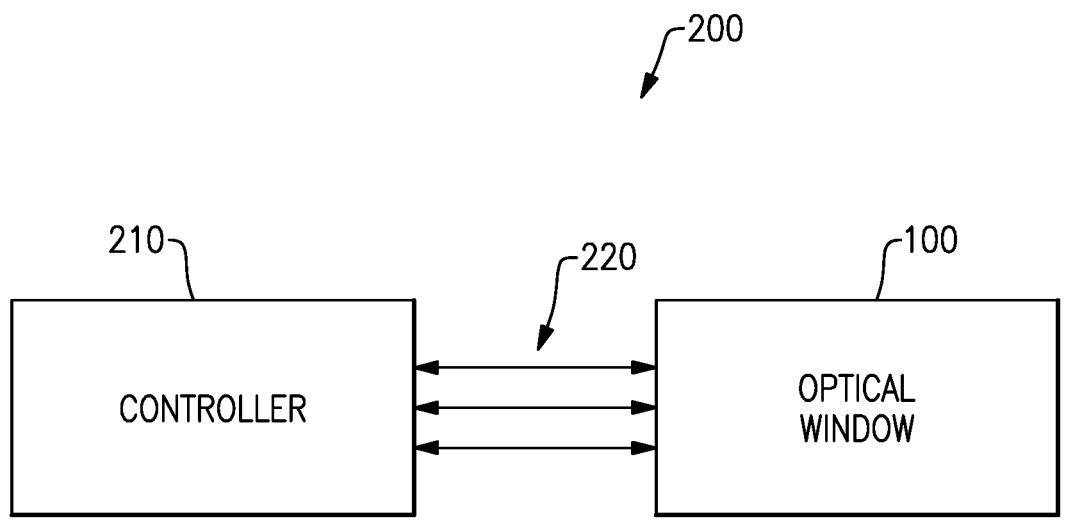
FIG. 3 is a block diagram of an example of an optical system according to aspects of the present invention.

As discussed above, individual groups or subsets of one or more wires of the first and second pluralities of wires 112, 114 of the EMI shield 110 can be monitored ("read out") and/or selectively biased to measure and optionally control the temperature profile of the optical window 100. Accordingly, referring to FIG. 3, an optical system 200 may include the optical window 100 and a controller 210 coupled to the optical window 100. The controller may receive measured information from the optical window (e.g., resistance measurements as discussed above) and optionally apply the individually controllable bias voltages to the EMI shield 110 via a plurality of measurement and control lines 220. The controller 210 may include various electronic components, as would be understood by those skilled in the art, to perform the functionality of taking measurements from the EMI shield 110 and optionally applying voltage and/or current to the EMI shield, as discussed above, to achieve the spatially localized temperature sensing and optional heating of the optical window 100. The controller 210 may be a dedicated controller associated with the optical window 100 and used to monitor and optionally control thermal characteristics of the optical window. In other examples, the controller 210 may be part of electronics included in the underlying optical system (e.g., an imaging system) with which the optical window 100 is used.

Thus, aspects and embodiments introduce a slight alteration to the integration of EMI wires into a structure, such as an optical window, to introduce temperature sensing and heating functionality. As discussed above, the heating functionality can be coupled to materials with temperature dependent properties and allow the heater wires to spatially adjust aperture properties. Thus, for optical windows, aspects and embodiments provide a structure that enables direct and localized sensing of window temperature with minimal impact to the window design and system SWaP-C.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:
1. An optical window comprising:
a first window layer of an optically transparent material;
a second window layer of the optically transparent material;
an electromagnetic interference shielding grid disposed between the first and second window layers and including a first electrically conductive structure and a second electrically conductive structure; and
a thermally sensitive material disposed between the first and second electrically conductive structures, the thermally sensitive material having an electrical property that varies as a function of temperature.

2. The optical window of claim 1 wherein the first electrically conductive structure includes a first plurality of electrically conductive wires and the second electrically conductive structure includes a second plurality of electrically conductive wires.

3. The optical window of claim 2 wherein the first and second pluralities of electrically conducive wires are arranged in a rectilinear grid with the first plurality of electrically conductive wires oriented in a first direction and the second plurality of electrically conductive wires oriented in a second direction perpendicular to the first direction.

4. The optical window of claim 1 wherein the thermally sensitive material forms a Schottky contact with at least some of the first plurality of electrically conductive wires or at least some of the second plurality of electrically conductive wires.

5. The optical window of claim 1 wherein the thermally sensitive material is a chalcogenide.

6. The optical window of claim 1 wherein the thermally sensitive material is one of germanium, zinc oxide (ZnO), vanadium oxide (VOx), and nickel chromium (NiCr).

7. The optical window of claim 1 wherein the thermally sensitive material is a semiconductor.

8. The optical window of claim 1 wherein the electrical property of the thermally sensitive material is electrical resistance.

9. An optical system comprising:
an optical window including a first window layer of an optically transparent material, a second window layer of the optically transparent material, an embedded electromagnetic interference shield and a thermally sensitive material disposed around the embedded electromagnetic interference shield, the electromagnetic interference shield including a first electrically conductive structure and a second electrically conductive structure, and the thermally sensitive material having an electrical property that varies as a function of temperature; and a controller coupled to the embedded electromagnetic interference shield and configured to measure the electrical property of the thermally sensitive material to determine a temperature profile of the optical window.

10. The optical system of claim 9 wherein the first electrically conductive structure includes a first plurality of electrically conductive wires and the second electrically conductive structure includes a second plurality of electrically conductive wires.

11. The optical system of claim 10 wherein the thermally sensitive material forms a Schottky contact with at least some of the first plurality of electrically conductive wires or at least some of the second plurality of electrically conductive wires.

12. The optical system of claim 10 wherein the first and second pluralities of electrically conducive wires are arranged in a rectilinear grid with the first plurality of electrically conductive wires oriented in a first direction and the second plurality of electrically conductive wires oriented in a second direction perpendicular to the first direction.

13. The optical system of claim 12 wherein the controller is configured to selectively bias one or more wires of the first plurality of electrically conductive wires and one or more wires of the second plurality of electrically conductive wires to resistively heat the selected wires of the first plurality of electrically conductive wires and of the second plurality of electrically conductive wires to locally alter the electrical property of the thermally sensitive material in a region proximate the selected wires of the first plurality of electrically conductive wires and of the second plurality of electrically conductive wires.

14. The optical system of claim 13 wherein the electrical property of the thermally sensitive material is electrical resistance.

15. The optical system of claim 13 wherein the controller is configured to selectively bias the selected wires of the first plurality of electrically conductive wires and of the second plurality of electrically conductive wires based on the temperature profile of the optical window.

16. The optical system of claim 13 wherein the thermally sensitive material is one of a chalcogenide, germanium, zinc oxide (ZnO), vanadium oxide (VOx), and nickel chromium (NiCr).

17. The optical system of claim 9 wherein the thermally sensitive material is a semiconductor.

* * * * *